United States Patent [19]

Rastegar

[11] Patent Number: 5,297,094
[45] Date of Patent: Mar. 22, 1994

[54] INTEGRATED CIRCUIT MEMORY DEVICE WITH REDUNDANT ROWS

[75] Inventor: Bahador Rastegar, Dallas, Tex.

[73] Assignee: SGS-Thomson Microelectronics, Inc., Carrollton, Tex.

[21] Appl. No.: 731,487

[22] Filed: Jul. 17, 1991

[51] Int. Cl.[5] .............................................. G11C 7/02
[52] U.S. Cl. ..................................... 365/210; 365/214
[58] Field of Search ................... 365/69, 202, 210, 214

[56] References Cited

U.S. PATENT DOCUMENTS

| 3,942,164 | 3/1976 | Dunn | 365/214 |
| 4,630,241 | 12/1986 | Kobayashi et al. | 365/200 |
| 4,870,619 | 9/1989 | Van Ness | 365/208 |

FOREIGN PATENT DOCUMENTS

| 0506474AI | 9/1992 | European Pat. Off. |
| 4005992AI | 7/1991 | Fed. Rep. of Germany |

*Primary Examiner*—James B. Mullins
*Attorney, Agent, or Firm*—Kenneth C. Hill; Lisa K. Jorgenson; Richard K. Robinson

[57] ABSTRACT

A dual-port memory device is provided which has a memory array divided approximately in half. The bit lines for the array are crossed over between array halves in order to minimize stray capacitance and cross-coupling capacitance for the device. Redundant rows are provided for the device which can be programmed to substitute for array rows containing non-functional bits. Preferably, the redundant rows are provided only in one-half of the array. The redundant rows can all be located in a first half of the array, with the second half of the array being the half which provides inverted data for one of the ports. If a redundant row replaces an array row in the second half of the array, and is written to by the port which reads and writes inverted data, the data must be reinverted prior to writing it to, or reading it from, the redundant row.

14 Claims, 4 Drawing Sheets

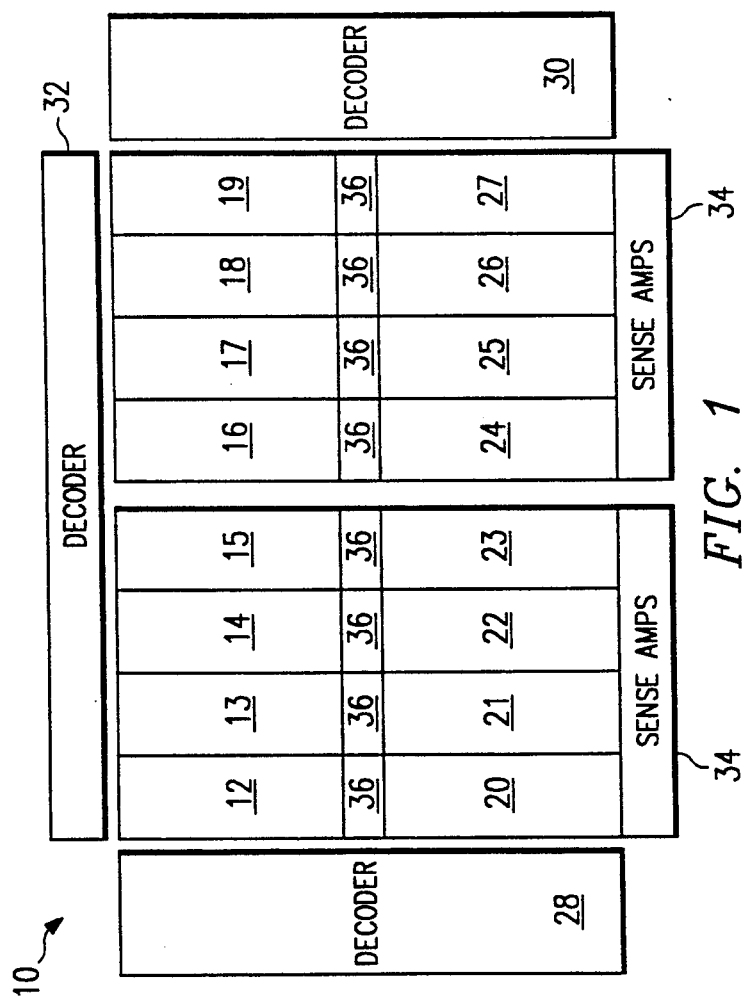
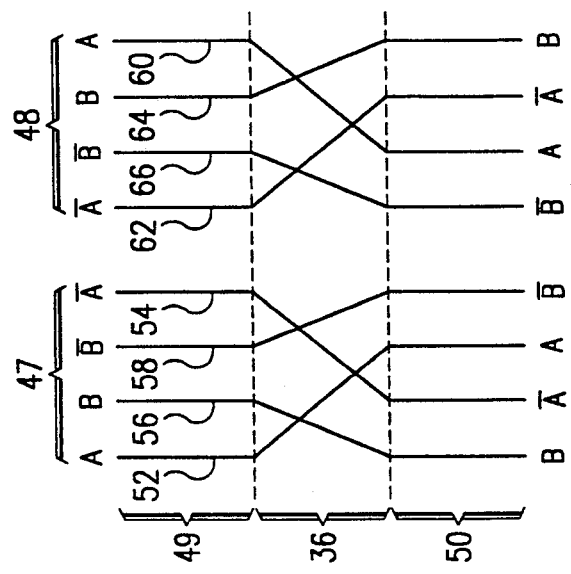
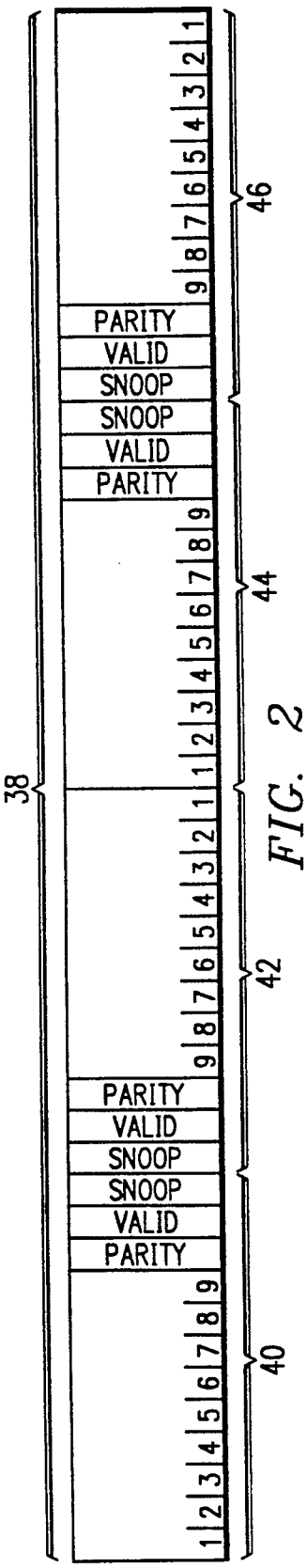

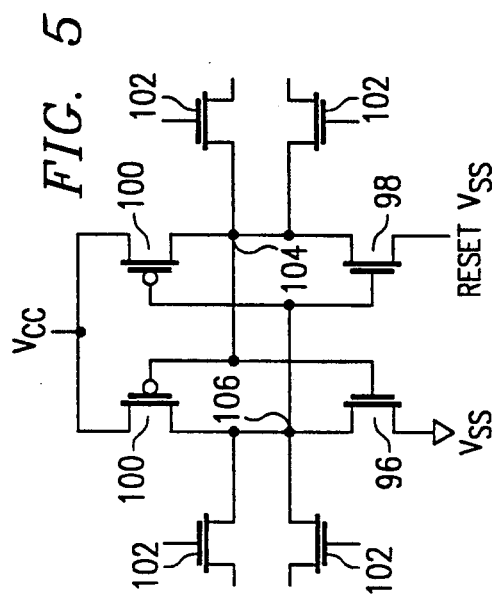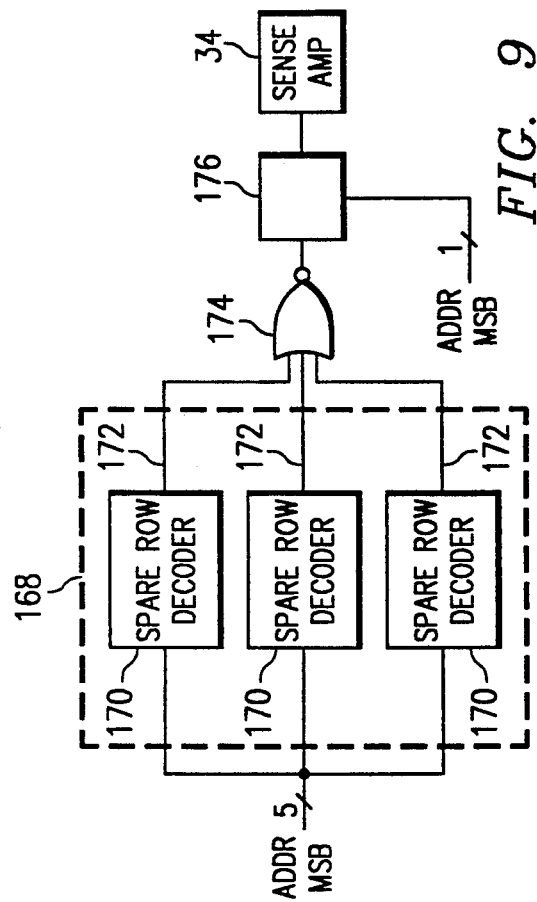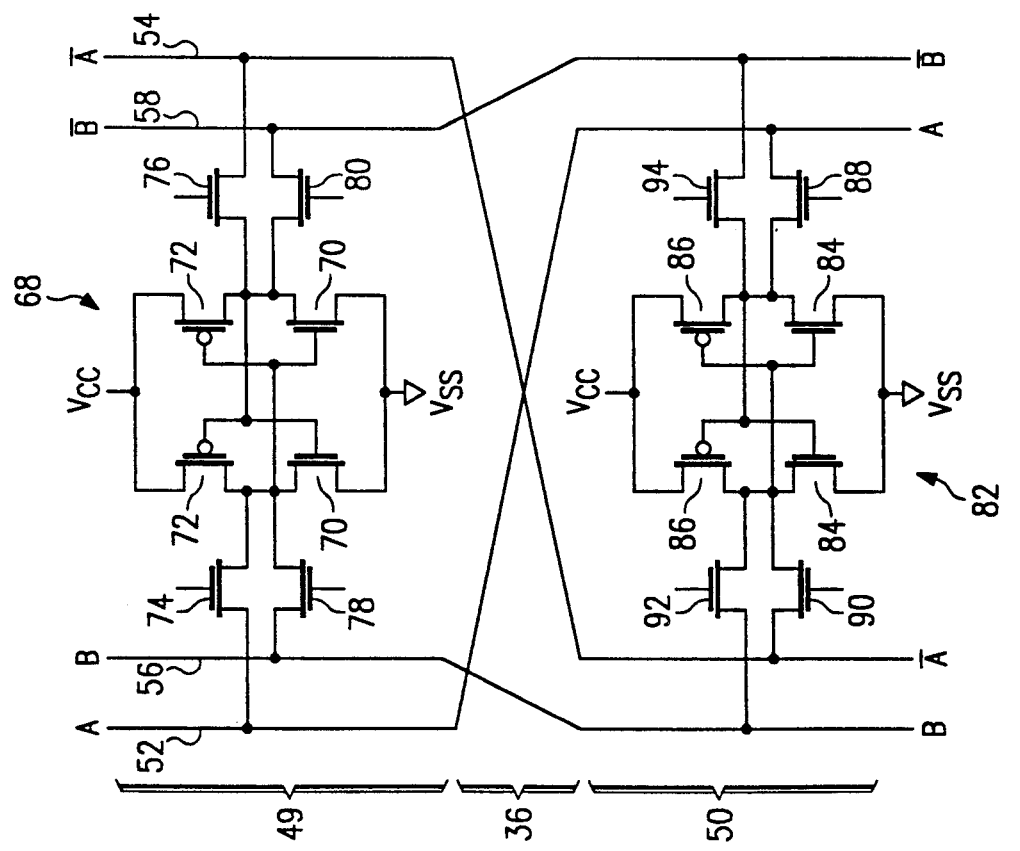

INTEGRATED CIRCUIT MEMORY DEVICE WITH REDUNDANT ROWS

CROSS REFERENCE TO RELATED APPLICATIONS

The present application is related to co-pending application Ser. No. 07/731,802, titled INTEGRATED CIRCUIT MEMORY DEVICE, by B. Rastegar, filed concurrently herewith, and co-pending application Ser. No. 07/731,803, titled INTEGRATED CIRCUIT MEMORY DEVICE HAVING FLASH CLEAR, by B. Rastegar, filed concurrently herewith, both of which are assigned to the assignee hereof and incorporated by reference hereinto.

The present application also contains subject matter in common with co-pending application Ser. No. 07/473,239, filed Jan. 31, 1990, titled Dual-Port Cache Tag Memory, co-pending application Ser. No. 07/677,313, filed Mar. 29, 1991, titled PARITY DETECT CIRCUIT, and co-pending application Ser. No. 07/693,670 filed Apr. 30, 1991, titled Control Circuit For Dual Port Memory, all of which are assigned to the assignee hereof and incorporated by reference hereinto.

BACKGROUND OF THE INVENTION

1. Field of the Invention

The present invention relates generally to semiconductor integrated circuit devices, and more specifically to dual port memory devices.

2. Description of the Prior Art

Computer systems utilize cache memories to enhance system performance. A data cache contains the cached data, and a cache tag memory contains the addresses of data stored in the cache. A processor, when making a memory access, accesses the desired memory location through the cache. If the desired location is already in the cache, access is complete. If it is not, the memory location is fetched from main system memory and loaded into the cache.

The speed of the integrated circuit devices used in the cache are important. The cache tag memory must provide a hit or a miss signal for every memory access by the processor. If the cache tag memory is slightly slow, the performance of the entire system suffers.

As is known in the art, one technique to improve the operating speed of integrated circuit devices is to reduce or balance stray capacitances. Memories have relatively long bit lines which contribute significantly to such capacitances. Good device design can help minimize such capacitances, but the nature of a memory device causes inevitable problems. Therefore, balancing of bit lines in a memory device layout is important.

No successful design has previously been done for a dual port cache tag memory device. In such a device, the capacitances for two sets of bit lines must be considered. In addition to stray capacitances, coupling capacitances between bit lines for the two ports can adversely impact device performance. In a dual port cache tag memory, in which speed is important, the extra problems caused by the extra bit lines can be significant.

Any device used in specialty designs such as cache tag memories must take special device functions into consideration. For example, cache tag memories must occasionally be cleared. One technique for clearing cache memories utilizes a flash clear, which clears only a single bit position within the memory. The cleared bit position is reset for all entries in the memory simultaneously. This allows the entire memory to be reset in a single step.

Special functions such as flash clear must be properly handled by any device design. Designs which improve device speed often do so at the expense of being able to handle more complex functions. Devices which can perform more complex functions such as flash clear often must sacrifice speed in order to do so.

It is known that memory devices can have non-functional bits as a result of processing variations. Rather than simply discard devices which have a small number of bad bits, redundant memory cells are usually provided on the device. These may be provided in the form of redundant rows or columns. The columns containing bad bits are disabled, typically by blowing fuse links, and the redundant columns are enabled to take their place. Mapping must be done in order to allow the redundant memory to substitute for bad regions anywhere on the device.

It would be desirable to provide a redundant memory scheme suitable for use with a dual port memory device. Such a scheme should be compatible with the use of the device as a cache tag memory. Preferably, the redundant memory is implemented in a manner compatible with enhancing device performance by minimizing stray and cross coupling capacitances. The redundant memory should be capable of being mapped to any location on the device which contains non-functional memory cells, and incorporating it into the device should not add significant complexity to the overall device design.

SUMMARY OF THE INVENTION

Therefore, according to the present invention, a dual-port memory device is provided which has a memory array divided approximately in half. The bit lines for the array are crossed over between array halves in order to minimize stray capacitance and cross-coupling capacitance for the device. Redundant rows are provided for the device which can be programmed to substitute for array rows containing non-functional bits. Preferably, the redundant rows are provided only in one-half of the array. The redundant rows can all be located in a first half of the array, with the second half of the array being the half which provides inverted data for one of the ports. If a redundant row replaces an array row in the second half of the array, and is written to by the port which reads and writes inverted data, the data must be reinverted prior to writing it to, or reading it from, the redundant row.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a plan view of a dual port memory integrated circuit device according to the present invention;

FIG. 2 illustrates a preferred bit position layout for the memory of FIG. 1;

FIG. 3 is a diagram illustrating a preferred bit line crossover arrangement for use with the circuit of FIG. 1;

FIG. 4 is a schematic diagram of two SRAM memory cells with crossed bit lines according to the diagram of FIG. 3;

FIG. 5 is a schematic diagram of a single SRAM memory cell which can be reset without writing a value on a bit line;

FIG. 9 is a block diagram of logic and control circuitry used for controlling operation of a sense amplifier in connection with the usage of redundant memory rows.

DESCRIPTION OF THE PREFERRED EMBODIMENT

Figure 6:
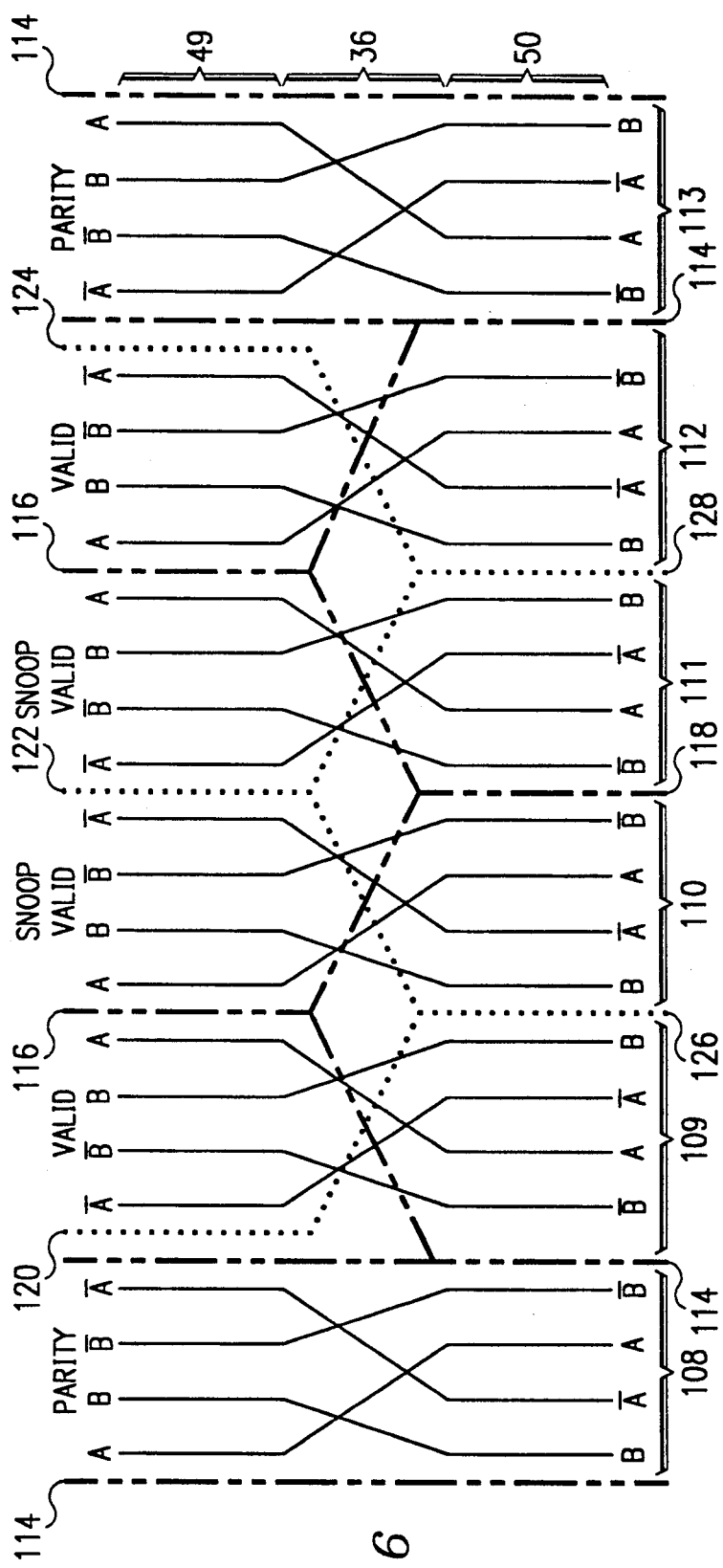
FIG. 6 is a diagram illustrating bit line layouts for several columns of cells, including Vss power supply lines used for flash clearing multiple columns within the memory array.

The present invention is related generally to a technique for laying out elements of a dual port memory device. Specifically, the description which follows is directed to a dual port cache tag memory. A preferred architecture for such a device, and the techniques for using it in a computer system, are described in detail in co-pending U.S. patent application Ser. No. 07/473,239, which has been incorporated by reference above.

In general, the following features, important to an understanding of the present invention, are incorporated into a preferred embodiment of a memory device. The preferred device is a dual port static random access memory (SRAM) device. It is designed to be used as a tag RAM for use in a computer system cache. The device has an A port, which is connected to a local processor. The device also has a B port, referred to as a "snoop" port, which is connected to a main system bus.

As known in the art, memory reads and writes generated by the local processor provide input to port A of the cache tag memory. If a match is found at the address location selected by the port A input, the corresponding data is stored in a separate data cache memory, and is made available to the local processor. If a miss occurs, the data must be fetched from the main system memory and loaded into the cache memory.

The snoop port is used to monitor activity on the main system bus. If another processor connected to the bus writes data into a memory location stored in the local cache, the local cache entry must be invalidated since the data stored in the cache is now out of date. The snoop port, when detecting a write into an address location which matches an entry in the cache tag memory, resets the value of a bit in the entry, known as the snoop valid bit, which indicates that the entry is invalid. When the snoop valid bit has been marked as invalid, that entry will register a miss the next time the local processor accesses it.

Port A is used to load data into the memory array. Port B is used only as a read port, except for changing the value of the snoop valid bit to indicate that an entry has been invalidated. In the preferred embodiment, parity checking is provided for each entry in the array, so that resetting the snoop valid bit will generate a parity error the next time the entry is read. In order to avoid this, as described in copending patent application Ser. No. 07/693,670, incorporated by reference above, the parity bit is also changed when the snoop bit is invalidated so that parity checking functions correctly after a snoop invalidation.

Referring to FIG. 1, a diagram illustrates the layout of a preferred embodiment of a dual port cache tag memory according to the present invention. The preferred embodiment is described as a 4K×12 dual port array, but it will be appreciated by those skilled in the art that other size memory arrays may take advantage of the invention described below. The array 10 includes sixteen array regions 12-27. Each region 12-27 contains a regular matrix of dual port SRAM memory cells as known in the art. Decoding circuits 28, 30, 32 are located around the periphery of the array 10.

Decoding circuitry 28 selects the row for port A, and decoding circuitry 30 selects the row for port B. Decoding circuits 28, 30 each decode some of the address bits for their respective ports. The remaining address bits are decoded by circuitry 32 and in the regions between adjacent array regions. For example, decoding circuitry is found between array regions 12 and 13, and 22 and 23. Since this is a dual port memory, two complete sets of decoding circuitry are required throughout the device. One set is used to decode addresses applied through port A, while the other is used to decode addressed applied through port B. The addressing of entries within the array 10 is completely independent and asynchronous between port A and port B.

As shown in FIG. 1, the bit lines run from top to bottom through the array, and terminate in sense amps 34. Sense amps 34 include two complete sets of sense amplifiers, one for port A bit lines and the other for port B bit lines. The sense amps are also completely independent and asynchronous, so that port A and port B can be read from and written to completely independently.

One possible arrangement for the decoding circuitry is to provide five bits of decoding to the port A and port B decoders 28, 30, thereby defining thirty-two main rows horizontally across the array 10. Each main row is subdivided into four local rows, so that the seven most significant bits (MSB) of the incoming address are used to select the row of the array 10.

The array 10 can be considered to be divided into eight blocks, with each block containing two array regions. For example, a block is defined by array regions 12 and 20, with another being defined by array regions 13 and 21 Since there are eight blocks, the next three most significant bits of the incoming address are used to select one of the blocks. As will be described in connection with FIG. 2, each block contains four columns, and the two least significant bits of the address are used to select one of these columns. It will be appreciated by those skilled in the art that various other decoding and addressing arrangements may be utilized.

Between each of the array regions in a block, there is a bit line cross-over region 36. These crossover regions are used to balance parasitic and coupling capacitances on the bit lines, thereby increasing the maximum operating speed of the device. In general, cross-over of signal lines is known in the art for balancing stray capacitances. However, the preferred embodiment utilizes a novel cross-over technique which will be described below.

Referring to FIG. 2, a chart illustrates a preferred positional layout for the bit lines of a single block 38. As described above, each block contains four columns 40, 42, 44, 46. Each column 40-46 contains twelve bits.

These twelve bits include nine data bits, a parity bit, a valid bit, and a snoop valid bit. Alternating columns 40–46 are laid out as mirror images, so that the valid and snoop valid bit positions of adjacent columns are physically positioned next to each other. This simplifies the routing of signal lines needed to reset the chip as will be described below.

Referring to FIG. 3, the layout of bit lines for two adjacent bit positions 47, 48 is shown. Each bit line has an upper half region 49 and a lower half region 50. Upper half region 49 for each bit position corresponds to one of the array regions 12–19, with the lower half region 50 corresponding to one of the array regions 20–27. Thus, the entire array can be considered as divided into an upper half 49 and a lower half 50. The bit lines are crossed as shown in the crossover region 36.

Each of the bit line positions 47, 48 corresponds to one bit position as shown in FIG. 2. For example, the bit line position 47 could correspond to bit position one of column 40, with bit line position 48 corresponding to bit position two of column 40. The bit lines for position 47 are inverted from those of 48 in order to better balance capacitive coupling and simplify certain other circuit layouts as will be described below. The alternating arrangement of bit lines shown in FIG. 3 is duplicated across the entire array 10 of the device.

Bit line 52 (FIG. 3) is the port A bit line for position 47, and bit line 54 is the complemented port A bit line. Bit lines 56 and 58 are the port B bit lines and complemented bit lines, respectively. Similarly, bit lines 60, 62, 64, 66 represent the corresponding port A and port A complemented bit lines, and port B and port B complemented bit lines, respectively.

In the crossover region 36 the port A bit lines 52, 54, which are on the outside of the bit position, cross over each other and become the middle two lines in the lower half of the array 50. The port B bit lines 56, 58, which are in the middle in the top half of the array 49, cross to the outside as shown for the lower half of the array 50.

The bit line arrangement just described balances stray capacitances on the bit lines to improve device speed. In addition, the illustrated crossover arrangement balances coupling capacitances between the bit lines for the two ports. This is achieved by placing the port A bit line next to the port B bit line in one half of the array, and placing the port A bit line next to the complemented port B bit line in the other half of the array. This physical adjacency to the true and complemented bit lines for the other port balances any effect which that port might have had on the bit line.

An example of the problems which can be caused by the coupling capacitance occurs when a read is being performed on port A while a write is being performed on port B. During the read on port A, the signals on the bit line are relatively small, requiring amplification by a sense amplifier. The writing process on the other port, however, uses approximately the full voltage swing available from the supply. This much larger voltage can induce charge onto the adjacent bit lines. Were the above crossover not utilized, errors in reading on a port could occur, and at best the time required to obtain an accurate reading of a bit is extended. Either situation is undesirable.

FIG. 4 illustrates the connections between the bit lines shown in FIG. 3 and the SRAM memory cells of the array. In FIG. 4, one cell is illustrated for the upper half 49 and one cell for the lower half 50. The crossover in the region is the same as that shown in FIG. 3.

SRAM cell 68 includes cross coupled N-channel latch transistors 70 and P-channel load transistors 72. If desired, resistive load devices can be used in place of the P-channel transistors 72 as known in the art. Access transistor 74 is connected to bit line 52, with access transistor 76 being connected to the complementary bit line 54. Port B access transistors 78, 80 are connected to the port B bit lines and complemented bit lines 56, 58, respectively.

In the lower half of the array 50, SRAM cell 82 contains cross-coupled latch transistors 84 and P-channel load transistors 86. Access transistors 88, 90 are used to access the SRAM cell 82 from the bit line and complemented bit line 52, 54 for port A. Port B access transistors 92, 94 are connected to the port B bit lines 56, 58, respectively.

In the upper half of the array 49, SRAM memory cell 68 is used to store a value as known in the art. The port A and port B bit lines access the same value of the cell 68. Thus, when a logical one is read from the cell 68 through port A, port B also reads out a logical one.

However, the situation changes in the lower half of the array 50. If a logical one is read from the SRAM cell 82 through port A, a logical zero is read out of the cell 82 through port B. This occurs because the complemented B bit line 58 is adjacent to the A bit line 52 in the lower half of the array, whereas the uncomplemented port B bit line 56 is adjacent to the port A bit line 52 and the upper half of the array.

The crossover pattern illustrated above provides a significant speed increase for the device because of the balancing of stray capacitances and cross-coupling capacitances. However, port B data is inverted in the lower half of the array from that read and written through port A. This situation is easily fixed by simply inverting the output of the port B sense amplifier if the row which has been accessed is in the lower half of the array 50. When data is written through port B, it is inverted prior to writing. In the preferred embodiment, the most significant address bit determines whether the address row is in the upper half 49 or the lower half 50 of the array. This same bit is then simply used to control inversion of the output of the port B sense amplifier if the selected row is in the lower half of the array. When data is written into the lower half of the array through port B, such as occurs when changing the value of the snoop valid bit or parity bit, as described above, the data is similarly inverted before it is written when the most significant bit indicates a lower array half address.

The inversion of data is a very simple logical operation. For example, if the most significant bit is zero for the upper half of the array and one for the lower half, the output from the port B sense amp can simply be Exclusive ORed with the most significant bit of the port B address. This will leave the data unchanged when the most significant bit is zero, and inverted when the most significant bit is one. Any equivalent logic circuitry can be used as will appreciated by those skilled in the art. The same gate is also used to invert data written into the array.

The bit line crossover pattern described above has advantages in that the bit line stray capacitances are balanced. Also, coupling capacitances between the two ports are cancelled. The result is a significant speed improvement for the device. The described crossover pattern involves crossing port A bit lines with port B bit lines, and it will appreciated by those skilled in the art that other crossover patterns may be suitable. For example, the port B bit lines could be located on the outside in the top half of the array. The crossover pattern shown in FIGS. 3 and 4 has proven to be a fast design with minimal unbalanced stray capacitances and coupling capacitances.

In the preferred embodiment, the cache tag memory can be cleared in a single step. Rather than writing a logical zero into every cell of the array, only the valid and snoop valid bits of each entry are reset. The power surge which would occur if every bit on the array were reset could cause latch up of CMOS circuitry in the periphery of the array, which is avoided by simply resetting two bits for each entry.

A preferred technique for resetting an SRAM memory cell without writing data through a bit line thereto is shown in FIG. 5. Latch transistors 96 and 98 form a cross coupled latch utilizing P-channel load transistors 100. Access transistors 102 connect to the bit lines and complemented bit lines for both port A and port B as described above, but are not involved in the flash clear resetting of the cell as will now be described.

Positive supply voltage Vcc is connected to the loads P-channel transistors 100 as shown. Transistor 96 is connected to the other side of the power supply Vss, which is preferably ground. The latch transistor 98 is connected to the supply voltage RESET Vss.

During normal operation of the cell, the signal RESET Vss is grounded. This causes the SRAM cell to operate in the usual manner well known in the art. When it is desired to reset the cell, the signal RESET Vss is ramped from ground to Vcc. If transistor 98 is already on, ramping RESET Vss high causes the voltage at node 104 to go high. This turns on transistor 96, forcing the voltage at node 106 low. The cell will then latch with transistor 96 turned on and transistor 98 off. RESET Vss is then returned to ground, and the cell will maintain the data latched into it. If transistor 98 was already on, the cell already stores a reset value, and ramping RESET Vss has no effect.

Resetting of the cell has been accomplished without writing any data to any bit lines. This provides a simple technique for resetting a bit position of the array. This technique is suitable for use with SRAM cells utilizing P-channel devices as loads. If resistive loads are used, other techniques known in the art can be used to reset the selected cells. As will be appreciated from the above description of the crossover scheme, the RESET Vss signal must be applied to one side of the cells in the upper half of the array, and to the opposite side in the lower half. A preferred technique for crossing over the Vss and RESET Vss signals to accomplish this is shown in FIG. 6.

Referring to FIG. 6, six bit positions 108–113 are shown. Consistent with the layout scheme shown in FIG. 2, bits 110 and 111 are the snoop valid bits for two adjacent columns. Bits 109 and 112 are the valid bits for the corresponding columns, with bits 108 and 113 being the parity bits for such columns. All of the remaining bits of each column are laid out identically to the parity bits 108, 113, with alternating mirror image bit positions used as shown in FIG. 3.

As described in detail in co-pending U.S. application Ser. No. 07/677,313, the preferred embodiment resets both the valid bit and snoop valid bit in order to reset the device during a flash clear operation. This allows logic circuitry to detect when the flash clear operation has been performed, and to disable parity checking. When both the valid and snoop valid bit have been reset to a logical zero, parity checking is disabled.

Only the valid and snoop valid bits are reset during a flash clear, so the signal RESET Vss is needed only for the bit positions corresponding to the valid and snoop valid bits. This means that only bit positions 109–112 need to be reset using the RESET Vss signal. Signal lines 114 illustrate the positioning of the normal (ground) Vss lines. For all bits except for the valid and snoop valid bits, a single Vss line 114 is located between each adjacent pair of bit positions.

Vss lines 116 are also permanently connected to ground, and cross over as shown in FIG. 6. In the upper half of the array 49, Vss lines 116 are located between bit positions 109 and 110, and between positions 111 and 112. In the crossover region 36, they crossover and make connection to Vss line 118 between bit positions 110 and 111 in the bottom half of the array 50. Lines 116 are also connected to the adjacent Vss lines 114 as shown.

In the upper half of the array 49, RESET Vss lines 120, 122, 124 are placed around the bit positions 109–112 as shown. In the crossover region 36, they crossover as shown to connect to RESET Vss lines 126, 128, in the lower half of the array 50. The RESET Vss lines 120–128 are positioned next to the complemented bit line for Port A at all times. This causes a flash clear operation, performed by ramping all of the RESET Vss lines 120–128 from ground to Vcc, to set all of the cells to the same value, as read by the port A sense amplifiers. As described above, the value read in the reset cells by the port B sense amplifier will be inverted for the bottom half of the array.

Locating the valid and snoop valid bits together and mirror imaging adjacent columns as shown in FIG. 2 allows a minimal number of RESET Vss lines 120–128 to be used to reset the array. When the crossovers for the Vss and RESET Vss lines are laid out, as shown in FIG. 6, a minimal amount of extra space is required for the extra signal lines. One extra line width between bit positions 108 and 109, and one line width between bit positions 112 and 113, are all that are required. This minimizes the area penalty which results from providing two sets of Vss signal lines (Vss and RESET Vss) to all of the cells which are to be reset by a flash clear operation.

Figure 7:
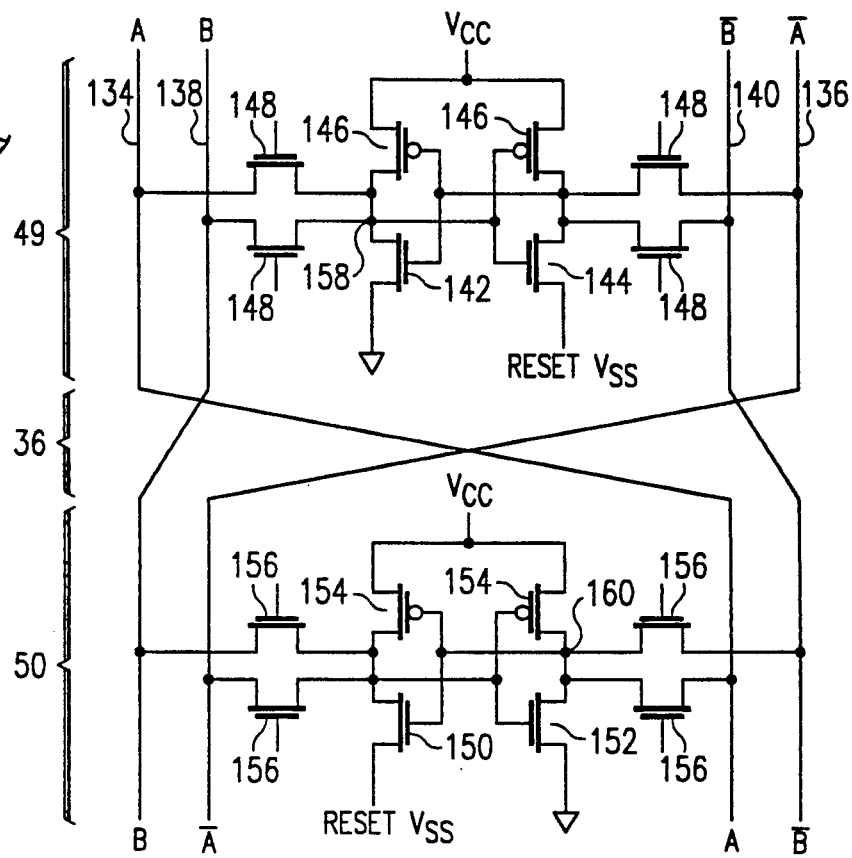
FIG. 7 is a schematic diagram of two SRAM memory cells illustrating the location of power supply Vss connections used to reset the cells.

Referring to FIG. 7, 2 SRAM memory cells 130, 132 are shown. Memory cell 130 is in the top half of the array 49, and memory cell 132 is in the bottom half of the array 50. The Port A bit line and complemented bit line 134, 136 cross over as described above in crossover region 36. The Port B bit line and complemented bit line 138, 140 also cross over in the crossover region 36 as described above.

SRAM cell 130 contains transistors 142, 144 cross-coupled as a latch with P-channel load transistors 146. Access transistors 148 connect the SRAM cell 130 to the bit lines 134–140.

SRAM cell 132 contains latch transistors 150, 152 and P-channel load transistors 154. Access transistors 156 connect the cell 132 to the bit lines 134–140.

As described above, the RESET Vss signal is connected to the latch transistor on the complemented Port A side of the cell. For SRAM cell 130, RESET Vss is connected to transistor 144. For cell 132, RESET Vss is connected to transistor 150. The RESET Vss lines are connected together as shown in FIG. 6. Ramping RESET Vss to a positive voltage and back to ground causes a low voltage to be stored on node 158 of cell 130, and on node 160 of cell 132. In both cases, this is read on bit line 134 (port A) as a logical 0. In the upper half of the array 49, Port B also reads a logical 0 in cell 130 after a flash clear on bit line 138. As described above, the crossover of bit line 132 causes port B to read a logical 1 in cell 132 after a flash clear. This value is inverted as it leaves the sense amps in cell 132 as in the lower half of the array 50.

The layout just described resets the cells to a logical "0+" (low) value. In some designs, it is desirable to reset the cells to a logical "1" (high) value. In such designs, the RESET Vss line should be coupled to the uncomplemented side of the cell. Operation otherwise proceeds as described.

The crossover arrangement described above provides for a flash clear reset of the device with the addition of minimal complexity. The flash clear operates properly with a device having a crossover arrangement for the bit lines, so that it can be used in a fast device having minimized stray and coupling capacitances. The described RESET Vss crossover arrangement adds very little additional space to the device layout.

It is well known in the art that redundant memory cells can be provided for memory arrays in order to replace bad memory cells. Enough spare rows or columns must be provided to replace all of the rows containing bad bits in most cases, but it is undesirable to provide too many redundant rows. Provision of an excessive number of redundant rows increases chip size unnecessarily, and can even contribute to a decreased overall yield.

For a device which is 4K × 12, as described above, 3 redundant rows has been determined to be an appropriate number. However, the crossover technique described previously provides that Port B outputs in the lower half of the array 50 are inverted. Thus, rows in the top half of the array 49 and the bottom half of the array 50 cannot be treated as identical rows, which would tend to indicate that 6 redundant rows must actually be used in the device.

Figure 8:
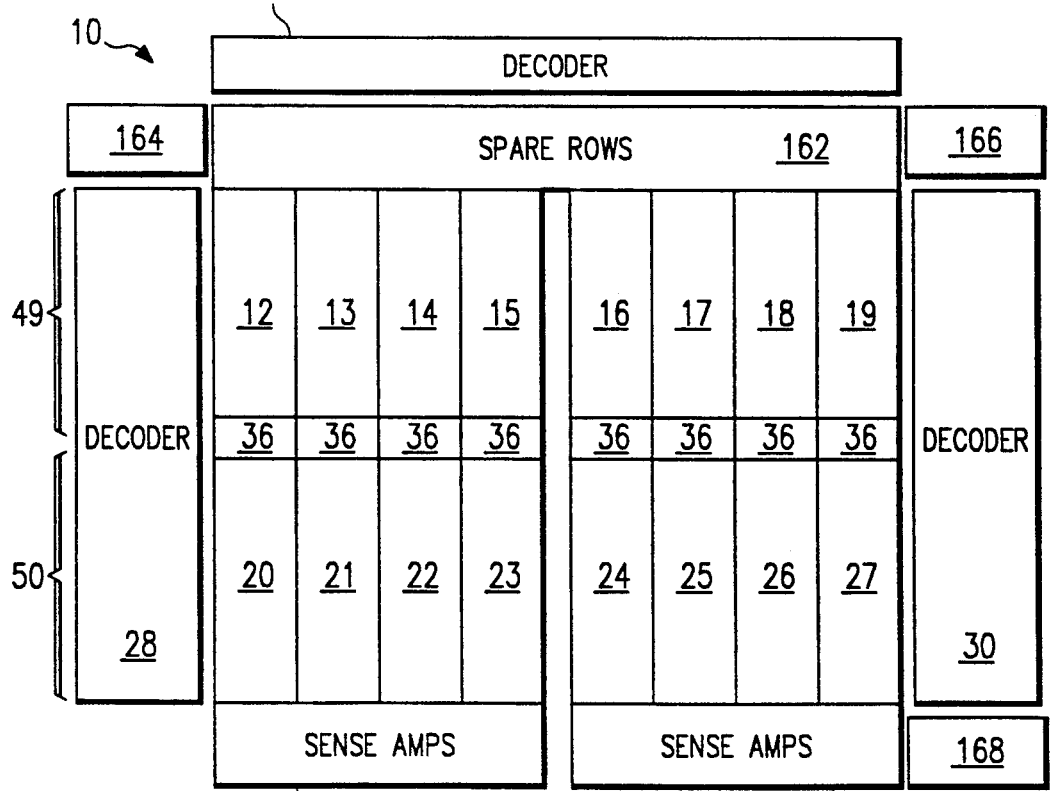
FIG. 8 is a plan diagram of a dual port memory integrated circuit device containing spare rows of memory for redundancy purposes.

Referring to FIG. 8, a chip layout and design is illustrated which requires only the inclusion of redundant, or spare, rows at a single location. The layout of FIG. 8 is the same as the layout of FIG. 1, with the addition of 3 spare rows 162 in the top half of the array. As known in the art, the spare rows 162 are addressed using a decoder block which has fuse links which are blown to enable the spare row and to define its address. Since this is a dual port memory, 2 such blocks are required. Circuit block 164 is the spare row decoder block for Port A, and circuit block 166 is the spare row decoder block for Port B. Use and design of such spare row decoder blocks 164, 166 is conventional, and well known in the art.

The spare rows 162 may be mapped to addresses which occur in either the upper half of the array 49 or the lower half of the array 50. The potential problem which arises occurs when an address from the lower half of the array 50 must be remapped into a spare row 162, which lies in the upper half of the array. As described above, the data read from the Port B sense amps 34 is inverted for addresses found in the lower half of the array 50. However, when such an address has been remapped into one of the spare rows 162, such inversion will actually cause the read or written value to be incorrect. That is, since the spare rows 162 are in the top half of the array 49, the true value in the cell is read and written by Port B instead of the inverted value.

In order to overcome this problem, an additional spare row decoder circuit 168 is provided for port B. In general, this block is an exact duplicate of the decoder block 166. It generates a signal indicating when a spare row is being used. If a spare row is being used at the same time that the actual row address is an address for the bottom half of the array, the data being read or written is inverted again. This causes the actual value for the cell to be read or written, since the Port B data is already inverted once during a read or write operation for bottom half addresses.

FIG. 9 illustrates a preferred control circuit for reinverting Port B data for lower array half addresses which are remapped to one of the spare rows 162. As described above, 3 spare rows are preferably used. Thus, the decoder circuitry 168 contains 3 spare row decoders 170. As known in the art, fuse links are blown within each of the spare row decoders 170 to program each one to a row address which is being replaced. The spare row decoder block 168 is identical to decoder block 166 and decoder block 164 in that each of the spare row decoders 170 generates an enable signal on an output line 172. With circuit blocks 164 and 166, these row enable output signals on lines 172 are used to enable the appropriate spare row 162 when it is addressed by the most significant 5 bits of the address applied for either Port A or Port B. The decoder block 168 works in an identical manner, with the addition of a NOR gate 174, which receives all of the outputs 172 from the spare row decoders 170. The enable lines 172 from decoder block 168 are not otherwise used.

A logical low output on an output line 172 indicates that particular spare row has not been enabled. A high value on an output line 172 indicates that the spare row has been enabled. Therefore, if none of the spare rows have been enabled, the output of NOR gate 174 is a logical 1. If any one of the spare row decoders 170 has been selected by the incoming address, the corresponding row enable output 172 is high, forcing the output from NOR gate 174 to be low. Thus, the NOR gate 174 provides a signal which indicates that one of the spare rows 162 is currently being addressed.

The output of NOR gate 172 is connected to logic block 176. The most significant address bit is also connected to logic block 176. As described above, the most significant address bit indicates whether the address row is in the upper half or lower half of the array. Assuming that a 1 on the most significant address bit indicates that the lower half of the array 50 has been selected, a 1 on such line combined with a 0 output from NOR gate 174 indicates that a spare row is being used to replace a row in the lower half of the array. In this event, an output is generated to the sense amplifier 34, indicating that the value sensed by the sense amplifier 34 needs to be inverted. This extra inversion corrects for the fact that the row actually addressed is in the upper half of the array, while the sense amplifiers for Port B will treat the sensed value as coming from the lower half of the array.

When no spare row is enabled, or the most significant address bit indicates that the replaced row is in the top half of the array, no changes are made to the sense amplifier value. Writing of data is treated the same as reading of data, so data is inverted when written into a spare row which is used to remap an address from the lower half of the array 50. In such event, the signal from logic block 176 is connected to the write buffer, which inverts the data before writing it into the cell.

The circuitry required to implement the extra Port B spare row decoder block 168 is less than that needed to provide separate spare rows for the lower half of the array 50. Data reinversion for lower half addresses is handled in a straightforward manner, so that the spare rows 162 can be used to remap addresses from any location within the array. This provides an overall space savings over providing redundant rows separately for the top and bottom halves of the array.

The device described above provides for improved high speed operation by minimizing unbalanced bit line capacitances. Balancing of the bit lines is done by crossing Port A and Port B bit lines over each other, as well as crossing the true and complement bit line for Port A over each other. In addition, adjacent bit lines are mirror imaged, which further reduces unbalanced stray capacitances. Crossing the lines so that port A and port B bit lines are adjacent in one half of the array, with the port A bit line being adjacent to the complemented port B bit line in the other half, balances coupling capacitances between the two ports. This provides faster operation and reduces the chance of data error caused by cross-talk. Twisting of bit lines in general is known with single port memory arrays to balance capacitances. However, the more complex crossover scheme used with a 2 port array provides additional speed over a straightforward application of known principles.

The more complicated crossover scheme described above provides improved device operating speeds, but complicates slightly the reading of data out of one of the ports. Techniques and circuits have been described which correct for data inversion in a straightforward, simple manner. These techniques do not add greatly to the complexity of the overall device. In addition, the bit line layouts described above provide a relatively straightforward technique for correcting for data inversion for Port B. Thus, overall chip complexity is not increased significantly, while device speed can be improved significantly.

While the invention has been particularly shown and described with reference to a preferred embodiment, it will be understood by those skilled in the art that various changes in form and detail may be made therein without departing from the spirit and scope of the invention.

What is claimed is:

1. A dual port memory device, comprising:
   an array of memory cells organized into rows and columns, said array having a first set of rows and a second set of rows, each row having an address;
   a plurality of bit lines for a first port, and a plurality of bit lines for a second port, all of said bit lines lying parallel to the array columns, wherein bit lines for the first port and the second port cross each other in a crossover region between the first and second set of rows;
   first means for inverting data read through the second port from rows having addresses corresponding to the second set of rows;
   at least one spare row of memory cells, said spare row belonging to said first set of rows;
   means for disabling a row of said array having a non-functional bit, and for mapping said spare row to be enabled by an address corresponding to such disabled row; and
   second means for inverting data read from a spare row mapped to an address corresponding to a disabled row in the second set of rows, whereby data read from such spare row is inverted twice, once each by said first means and said second means.

2. The device of claim 1, wherein said at least one spare row comprises three spare rows of memory cells.

3. The device of claim 1, wherein said means for disabling comprises:
   for each row of said array, a fuse link which can be set to permanently disable the row; and
   for each spare row, a programmable decoder corresponding to each port, wherein said programmable decoders can be programmed to enable the spare row when the corresponding port presents an address intended to enable the disabled row.

4. The device of claim 3, wherein said second means comprises:
   a second programmable decoder for the second port for each spare row and programmed the same as the spare row decoders, wherein said second programmable decoders generate an enable signal when the spare rows are enabled; and
   logic circuitry connected to said second programmable decoders and to a most significant bit for a second port address, said logic circuitry generating an inversion signal to cause inversion of data read from the spare row when the corresponding disabled row is in the second set of rows.

5. The device of claim 1, further comprising:
   third means for inverting data written through the second port to rows having addresses corresponding to the second set of rows.

6. The device of claim 5, further comprising:
   fourth means for inverting data written to cells in the second set of rows through the second port.

7. The device of claim 6, wherein said second means also causes data written to a spare row mapped to an address corresponding to a disabled row in the second set of rows to be inverted, whereby data written to such spare row is inverted twice, once each by said third means and said fourth means.

8. The device of claim 7, wherein said fourth means comprises:
   a second programmable decoder for the second port for each spare row and programmed the same as the spare row decoders, wherein said second programmable decoders generate an enable signal when the spare rows are enabled; and
   logic circuitry connected to said second programmable decoders and to a most significant bit for a second port address, said logic circuitry generating an inversion signal to cause inversion of date written to the spare row when the corresponding disabled row is in the second set of rows.

9. A method for transmitting data to and from a dual port memory array, comprising the steps of:
   for data written into a first and a second set of rows in the array from a first port, writing uncomplemented data into the array;
   for data written into the first set of rows from a second port, writing uncomplemented data into the array;
   for data written into the second set of rows from the second port, complementing the data prior to writing it into the array; and for data written into a spare row substituted for a row in the second set of rows, complementing the data twice before writing it into the array.

10. The method of claim 9, further comprising the step of:
for data written into a spare row substituted for a row in the first set of rows, writing uncomplemented data into the array.

11. The method of claim 9, further comprising the steps of:
defining the first and second sets of rows to have addresses differing in a single bit position; and
when writing data from the second port, determining whether to invert the data by detecting a value for the single bit position of the second port address.

12. The method of claim 11, wherein the determining step comprises the step of:
when writing data from the second port, determining whether to invert the data by detecting a value for the most significant bit of the second port address.

13. The method of claim 9, further comprising the steps of:
for data read from the first port, reading such data as uncomplemented data;
for data read from the first set of rows by the second port, reading such data as uncomplemented data;
for data read from the second set of rows by the second port, reading such data as complemented data; and
for data read from a spare row substituted for a row in the second set of rows, complementing the data twice after reading it from the array.

14. The method of claim 13, further comprising the step of:
for data read from into a spare row substituted for a row in the first set of rows, reading the data as uncomplemented data.

* * * * *